United States Patent [19]

Tada et al.

[11] Patent Number: 4,608,535
[45] Date of Patent: Aug. 26, 1986

[54] MAGNETIC FIELD AND CURRENT MEASURING DEVICE USING A FARADAY CELL WITH A THIN ELECTRICALLY CONDUCTIVE FILM SUBSTANTIALLY COVERING THE FARADAY CELL

[75] Inventors: Kohji Tada; Yoshiki Kuhara; Masami Tatsumi; Tsutomu Mitsui, all of Osaka, Japan

[73] Assignee: Sumitomo Electric Industries, Ltd., Osaka, Japan

[21] Appl. No.: 446,395

[22] Filed: Dec. 2, 1982

[30] Foreign Application Priority Data

Dec. 7, 1981 [JP] Japan ............................ 56-197350

[51] Int. Cl.[4] .................. G01R 33/02; G01R 31/00; G02B 5/30
[52] U.S. Cl. ............................... 324/244; 324/96; 350/374
[58] Field of Search ............... 324/96, 244, 117 R; 350/376, 375, 374; 307/91

[56] References Cited

U.S. PATENT DOCUMENTS

| 3,420,601 | 1/1969 | Young et al. | 350/374 |
| 3,621,390 | 11/1971 | Von Willisen | 324/244 |
| 3,980,949 | 9/1974 | Feldtkellor | 324/96 |
| 4,239,337 | 12/1980 | Campbell et al. | 350/375 |
| 4,465,969 | 8/1984 | Tada et al. | 324/96 |

FOREIGN PATENT DOCUMENTS

| 280413 | 4/1970 | Austria . |
| 2924804 | 1/1981 | Fed. Rep. of Germany . |

OTHER PUBLICATIONS

*Optical Engineering*/Jan./Feb. 1981/vol. 20, No. 1, "High-Voltage Current Transformers with Optical Signal Transmission".
*Applied Optics*/Nov. 15, 1980/vol. 19, No. 22, "Magnetooptical Current Transformer 1-3".
*Electrical Review*/Sep. 16, 1977/vol. 201, No. 11, "Optical Methods for Measurement of Current and Voltage at High Voltage".
Feldman et al., "Optical Activity and Faraday Rotation in Bismuth Oxide Compounds", *Applied Physics Letters*, vol. 16, No. 5, Mar. 1, 1970, pp. 201-202.

*Primary Examiner*—Ernest F. Karlsen
*Assistant Examiner*—Walter E. Snow
*Attorney, Agent, or Firm*—McCormick, Paulding & Huber

[57] ABSTRACT

A magnetic field and electric current measuring device which uses bismuth silicon oxide ($Bi_{12}SiO_{20}$) or bismuth germanium oxide ($Bi_{12}GeO_{20}$) as a Faraday cell, and which is so adapted that polarized light which enters the cell is passed back and forth through the cell along the optic axis thereof to cancel any change in optical rotatory power ascribable to a variation in temperature. A magnetic field applied in the direction of the optic axis of the Faraday cell is measured based on the angle of rotation of the polarization plane of the polarized light. The surface of the Faraday cell may be coated with a transparent and electrically conductive thin film to eliminate the effects of external electric fields.

3 Claims, 5 Drawing Figures

MAGNETIC FIELD AND CURRENT MEASURING DEVICE USING A FARADAY CELL WITH A THIN ELECTRICALLY CONDUCTIVE FILM SUBSTANTIALLY COVERING THE FARADAY CELL

BACKGROUND OF THE INVENTION

This invention relates to a field measuring device for measuring magnetic fields and electric currents by making use of the Faraday effect.

The Faraday effect refers to a phenomenon wherein the plane of polarization of light passing through an optical material rotates in proportion to the strength of a magnetic field applied in the direction of the optic axis. Furthermore, an element consisting of an optical material having such property is referred to as a Faraday cell.

The Faraday effect may be understood from the example illustrated in FIG. 1, in which light 2, whose direction of polarization is taken as the y-direction, is incident upon an optical material 1 of length l. When a magnetic field H is applied in the same direction as the light 2, the direction of polarization of the emergent light is rotated by an angle $\theta$ proportional to H and l. This is illustrative of the Faraday effect. The angle $\theta$ is represented by:

$$\theta = Ve \cdot l \cdot H \quad (1)$$

where the constant of proportionality Ve is referred to as Verdet's constant.

In FIG. 2, which is useful in describing an arrangement for measuring a magnetic field or a current, light emitted from a light source 6 is converted into linearly polarized light by a polarizer 7. Upon passage through the optical material 1, the linearly polarized light is intercepted by an analyzer 8 which isolates the change in optical intensity caused by the change in direction of polarization. The light which emerges from the analyzer 8 is converted into an electrical signal $V_{out}$ by a photodetector 9. When the angle defined by the polarizer 7 and analyzer 8 is set to 45 degrees, the electrical signal $V_{out}$ delivered by the photodetector is expressed by:

$$V_{out} = \tfrac{1}{2} \cdot K \cdot (1 + \sin 2\theta) \quad (2)$$

where K is a constant decided by the intensity of the incident light and the sensitive of the photodetector 9. If we extract the change which is due to the applied magnetic field, then Eq. (2) will give us:

$$\begin{aligned}\Delta V_{out} &= 1/2 \cdot K \cdot \sin 2\theta \simeq 1/2 \cdot K \cdot 2\theta \\ &= K \cdot Ve \cdot l \cdot H\end{aligned} \quad (3)$$

Thus, when $\theta$ is small, an output proportional to the applied magnetic field H can be obtained. It is well known that placing an apparatus of this kind below a conductor 10 carrying an electric current makes it possible to measure the magnetic field produced by the current and, hence, the magnitude of the current itself.

Conventionally, lead glass is the material most widely used to fabricate a Faraday cell. The reason is that lead glass exhibits a comparatively large Verdet's constant (0.093 min/Oe.cm for a wavelength $\lambda$ of 633 nm.), and because of its intrinsically favorable temperature stability, which is one of the characteristics of diamagnetic glass. It has also become possible to manufacture glass which, owing to the addition of other metal elements (such as Tb), exhibits a Verdet's constant approximately twice that of lead glass. Such glass is paramagnetic, however, and therefore is disadvantageous in that Verdet's constant varies inversely with absolute temperature T, giving an unfavorable temperature characteristic.

Accordingly, one object of the present invention is to provide a current and field measuring device having excellent characteristics acquired through use of a Faraday cell the sensitivity of which is higher than that of lead glass but which also exhibits highly favorable temperature stability.

To attain the foregoing object, the Faraday material employed in the invention is bismuth silicon oxide ($Bi_{12}SiO_{20}$) or bismuth germanium oxide ($Bi_{12}GeO_{20}$), hereinafter referred to as BSO and BGO, respectively.

That BSO and BGO exhibit a comparatively large Verdet's constant (0.2 min/Oe.cm in both instances) is known from *Applied Physics Letters*, vol. 16, No. 5, (1970), p. 201. However, both of these compounds have an optical rotatory power which causes the direction of polarization to rotate even in the absence of an applied magnetic field, and the optical rotatory power involves a degree of temperature dependence. Moreover, both compounds exhibit an electrooptic effect, namely the Pockels effect, and thus are influenced by electric fields. For these and other reasons, BSO and BGO have not heretofore found use in Faraday cells.

A second object of the present invention, therefore, is to devise an expedient for eliminating the foregoing disadvantages to provide a field and current measuring device which exhibits the excellent temperature stability intrinsically possessed by diamagnetic substances, but which employs BSO or BGO to exploit the advantage offered by these materials, namely a sensitivity that is twice that of lead glass.

To this end, the inventors have discovered a method capable of sensing the influence solely of the Faraday effect, free of temperature dependence, by devising means for cancelling optical rotatory power ($\sigma^\circ$/mm) as well as the change thereof with temperature ($\Delta\sigma/\Delta T$). Accordingly, the second object of the invention is attained by providing a field and current measuring device to which the aforementioned discovering is applied.

Other features and advantages of the invention will be apparent from the following description taken in conjunction with the accompanying drawings.

DESCRIPTION OF THE PREFERRED EMBODIMENT

In the course of physical investigations regarding the angle of rotation $\theta_o$ of a polarization plane caused by optical rotatory power and the angle of rotation $\theta_H$ caused by the Faraday effect in connection with BSO and BGO, the inventors discovered that passing polarized light back and forth through a crystal causes the optical rotatory power to diminish to zero and doubles the Faraday effect, and found that favorable results are obtained when such principle is applied to a device for measuring a magnetic field or electrical current.

Figure 1:
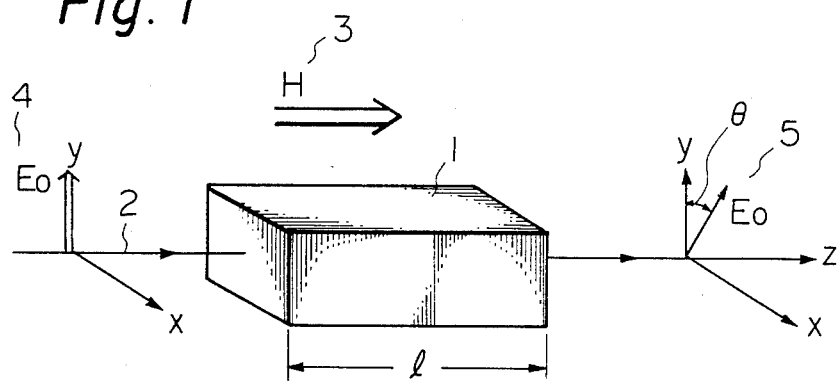
FIG. 1 is a diagram useful for describing the Faraday effect.
Figure 2:
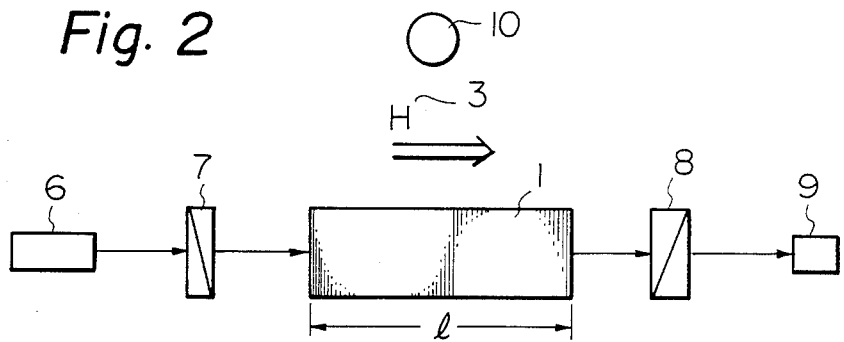
FIG. 2 is a diagram of an arrangement for measuring a magnetic field or an electric current.
Figure 3:
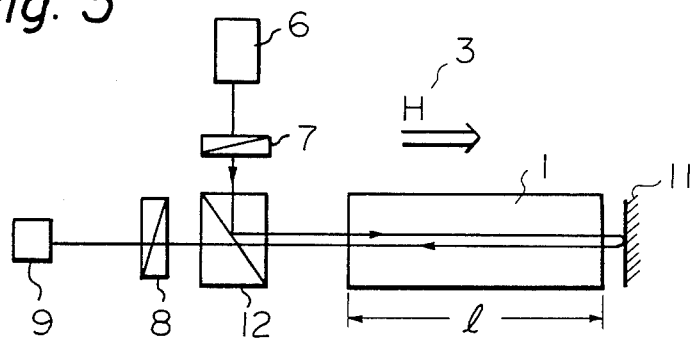
FIG. 3 is a diagram of an arrangement embodying the present invention.

FIG. 3 shows the optical system that was used to conduct an experiment based on the above principle. The set-up includes a total reflection mirror 11 and a beam splitter 12, which cooperate to pass the polarized light back and forth through the optical material 1, the latter being a crystal having a length of 40 mm. By holding the magnetic field strength constant and measuring the output of the photodetector 9 while varying the temperature of the crystal 1 (BSO or BGO) from $-10°$ to $+60°$ C., it was found that the fluctuation in optical output caused by the change in temperature fell within a measurement error range of $\pm 0.3\%$, indicating complete cancellation of temperature dependence as far as optical rotatory power is concerned. In contrast, when the polarized light was passed through the crystal only once, and not back and forth, optical rotatory power diminished at a rate of $-0.2°/30°$ C. /mm with a rise in temperature, with the result that the angle of rotation attributed to optical rotatory power fluctuated by as much as $\pm 8°$ at temperatures of 30° C.$\pm 30°$. A fluctuation of this order is on the same level as the angle of rotation caused by the applied field and would impose an error of several dozen to several hundred percent, making such an arrangement unfit for use.

The change in optical rotatory power with temperature is cancelled by passing the polarized light back and forth through the crystal in the aforementioned manner because the overall angle of rotation $\theta$ of the polarization plane is given by the following when the light makes the round trip through the crystal:

$$\theta = (\theta_o + \theta_H) + (-\theta_o + \theta_H) = 2\theta_H \quad (4)$$

where $\theta_o$ represents the angle of rotation attributed to rotatory power, and $\theta_H$ represents the angle of rotation resulting from the Faraday effect. It goes without saying that the number of round trips through the crystal can take on a large value, in which case sensitivity will be enhanced in proportion to the number of such round trips. It should also be noted that the reflective mirror can be affixed directly to the surface of the BSO or BGO crystal.

The present invention as described above makes it possible to measure a magnetic field or an electric current with good temperature stability and high sensitivity, a sensitivity that is about twice that obtainable with lead glass. Still, since the above-described arrangement of the apparatus causes the light, incident upon the crystal in the form of linearly polarized light, to be checked into elliptically polarized light owing to the electro-optical effect of the BSO or BGO, the electrical signal obtained is influenced, though only slightly, by electric field strength when an electric current in a high-voltage conductor such as a power transmission line is measured. In such case the influence upon the electric signal gives rise to a measurement error.

Upon considering various methods of solving the aforementioned problem, the inventors have found that an effective expedient is to cover the entire crystal with a transparent and electrically conductive material, thereby converting the crystal surface into an equipotential surface which prevents an electric field from acting upon the interior of the crystal.

Figure 4:
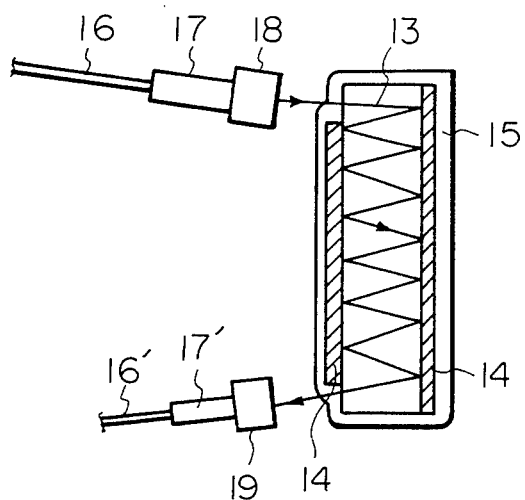
FIG. 4 is a diagram of an arrangement embodying the present invention, provided with an electrically conductive layer.

An exemplary arrangement for realizing the above is as illustrated in FIG. 4, in which an optically polished crystal plate 13 made of BSO or BGO and having a thickness of 3 mm has a reflective layer 14 composed of multiple-layer dielectric films formed on both sides thereof. Thereafter, a transparent electrode 15 consisting of $In_2O_3$ or $In_2O_3$-$SnO_2$ is deposited on the entire surface of the resulting structure by means of an RF sputtering technique. In the resulting device, referred to as device A hereinafter, LED light is introduced by an optical fiber 16, converted into a parallel luminous flux by a rod lens 17 and then into linearly polarized light by a polarizing prism 18. The polarized light enters the BSO or BGO crystal plate 13 and, after making seven round trips within the plate because of repeated reflection off the reflective layers 14, exits from the plate and passes through an analyzing prism 19 defining an angle of 45 degrees with the polarizing prism 18. The emergent light then enters a rod lens 17' and is thence guided to a photodetector, not shown, by an optical fiber 16'.

Figure 5:
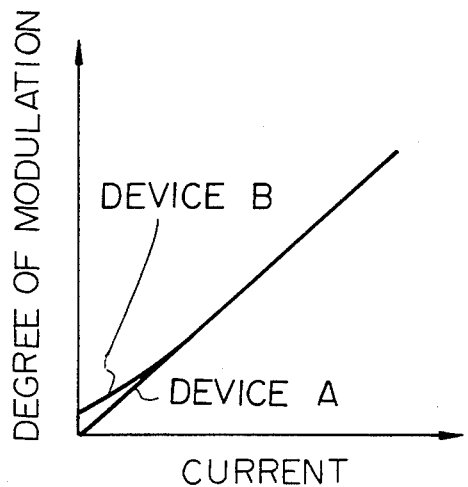
FIG. 5 is a graph illustrating the effects of the embodiment shown in FIG. 4.

For comparison purposes, a similar device, but one devoid of the transparent electrode, was prepared and is referred to as device B. Both devices A and B were employed to measure the electric current flowing within a gas-insulated high-voltage power transmission line. The results are depicted in FIG. 5, which shows that the relation between current and the modulation degree of optical output is linear with device A. With device B, on the other hand, there is some shift away from linearity in the low current region, indicating a degree of modulation greater than the value corresponding to the current. The latter is attributed to the fact that since electric field strength directly below a transmission line is as high as several hundred to several thousand volts per millimeter, modulation arising from electro-optic effects is brought about because of the manner in which the apparatus is arranged. In any event, it is clear from the comparison that the device (device A) of the present invention is absolutely free of the effects of external electric fields.

In accordance with the present invention as described and illustrated hereinabove, an excellent field and current measuring device can be obtained because of the following reasons:
(1) The device utilizes BGO or BSO, either of which has a larger Verdet's constant than lead glass, and is therefore capable of performing measurements with a very high sensitivity.
(2) By passing the polarized light back and forth through the crystal a predetermined number of times, any change in the optical rotatory power owing to a temperature change is cancelled. The angle of rotation of the polarization plane therefore remains constant, so that the device is very stable with respect to variations in temperature.
(3) Because the entire crystal is coated with a transparent and electrically conductive material to convert the crystal surface into an equipotential surface, the resulting device is completely free of the effects of external electric fields.

As many apparently widely different embodiments of the present invention may be made without departing from the spirit and scope thereof, it is to be understood that the invention is not limited to the specific embodiments thereof but only as defined in the appended claims.

What is claimed is:

1. A magnetic field and electric current measuring device which comprises:
   a Faraday cell made of a material selected from the class consisting of bismuth silicon oxide ($Bi_{12}SiO_{20}$) and bismuth germanium oxide ($Bi_{12}GeO_{20}$),
   an electrically conductive thin film applied to the outer surface of said Faraday cell and substantially completely surrounding said cell to provide an equipotential surface which prevents an electric field from acting upon the interior of said cell, and
   means for passing polarized light back and forth at least once through said Faraday cell along the optic axis thereof,
   a magnetic field applied in the direction of the optic axis of said Faraday cell being measured based on an angle of rotation of the polarization plane of said polarized light.

2. The magnetic field and electric current measuring device according to claim 1, further characterized by said electrically conductive thin film being transparent, said polarized light passing through said thin film in entering said cell and also passing through said thin film in leaving said cell.

3. The magnetic field and electric current measuring device according to claim 2 further characterized by said thin film being made from a material selected from the class consisting of $In_2O_3$ and $In_2O_3\text{-}S_nO_2$.